(12) United States Patent
Meyer et al.

(10) Patent No.: US 8,471,393 B2
(45) Date of Patent: Jun. 25, 2013

(54) SEMICONDUCTOR COMPONENT INCLUDING A SEMICONDUCTOR CHIP AND A PASSIVE COMPONENT

(75) Inventors: Thorsten Meyer, Regensburg (DE);
Bernd Waidhas, Pettendorf (DE);
Markus Brunnbauer, Lappersdorf (DE); Grit Sommer, Grafing (DE);
Thomas Wagner, Zirndorf (DE)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 11/614,579

(22) Filed: Dec. 21, 2006

(65) Prior Publication Data

US 2008/0135977 A1 Jun. 12, 2008

(30) Foreign Application Priority Data

Dec. 7, 2006 (DE) .......................... 10 2006 058 068

(51) Int. Cl.
*H01L 23/522* (2006.01)
(52) U.S. Cl.
USPC ............................ 257/784; 257/528; 257/787
(58) Field of Classification Search
USPC ......................... 257/528, 787, 784
See application file for complete search history.

(56) References Cited

U.S. PATENT DOCUMENTS

| | | | |
|---|---|---|---|
| 5,576,680 A * | 11/1996 | Ling | 336/200 |
| 5,886,587 A | 3/1999 | Sturdivant | |
| 5,909,050 A | 6/1999 | Furey et al. | |
| 6,148,500 A * | 11/2000 | Krone et al. | 29/602.1 |
| 6,441,715 B1 * | 8/2002 | Johnson | 336/200 |
| 6,496,113 B2 * | 12/2002 | Lee et al. | 340/572.7 |
| 6,642,811 B2 | 11/2003 | Daniels et al. | |
| 6,784,551 B2 | 8/2004 | Auburger et al. | |
| 7,531,893 B2 * | 5/2009 | Koduri | 257/676 |
| 2002/0190389 A1 | 12/2002 | Koenck | |
| 2005/0124093 A1 | 6/2005 | Yang et al. | |
| 2005/0129989 A1 * | 6/2005 | Edwards | 429/7 |
| 2007/0069397 A1 * | 3/2007 | Van Lerberghe et al. | 257/784 |

FOREIGN PATENT DOCUMENTS

| | | |
|---|---|---|
| DE | 4432725 | 1/1996 |
| WO | 0106818 A1 | 1/2001 |

* cited by examiner

*Primary Examiner* — Howard Weiss
*Assistant Examiner* — Tifney Skyles
(74) *Attorney, Agent, or Firm* — Edell, Shapiro & Finnan, LLC

(57) ABSTRACT

A semiconductor component includes a semiconductor chip, and a passive component, with the semiconductor component including a coil as the passive component. The semiconductor chip and the passive component are embedded in a plastic encapsulation compound with connection elements to external contacts.

20 Claims, 11 Drawing Sheets

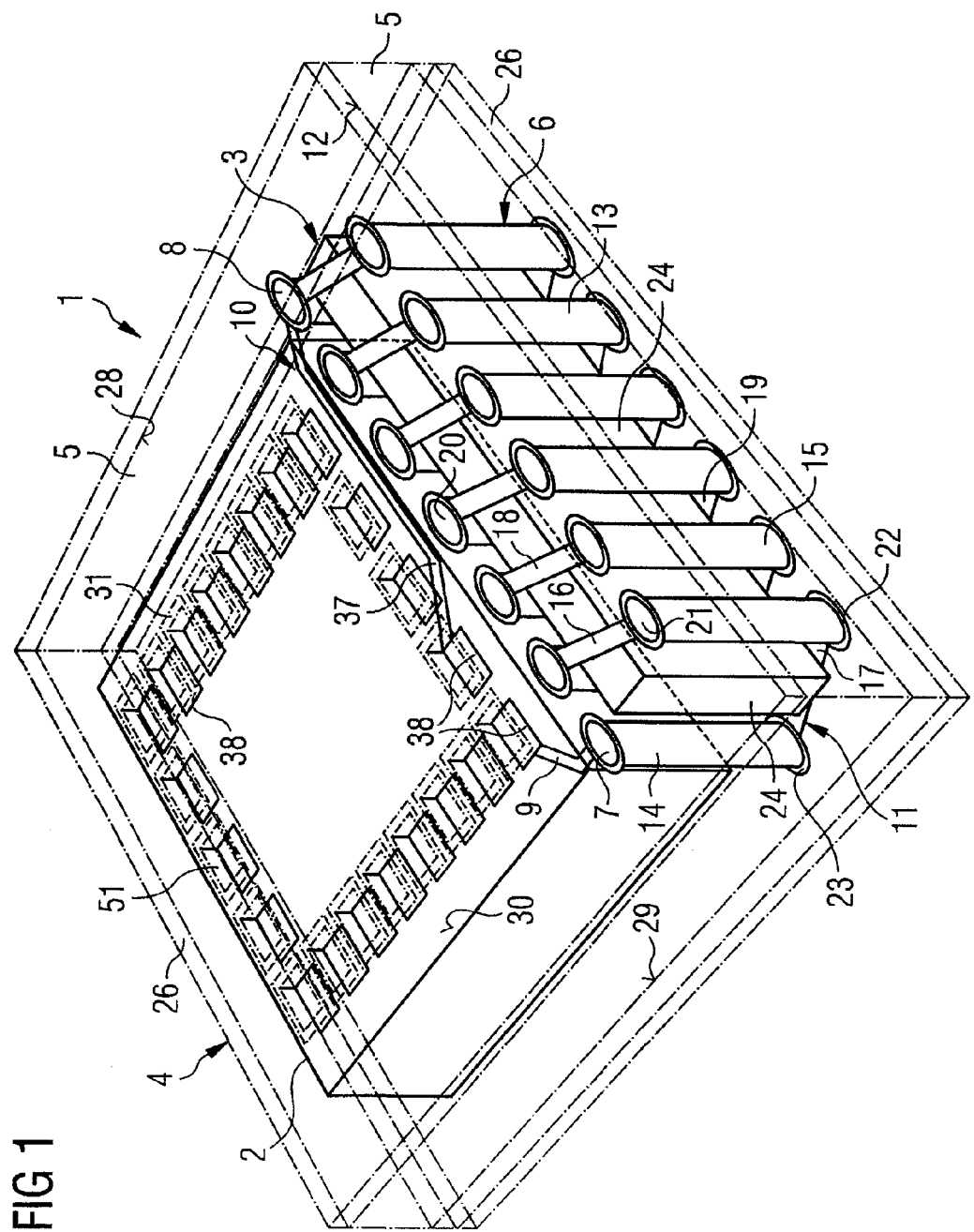

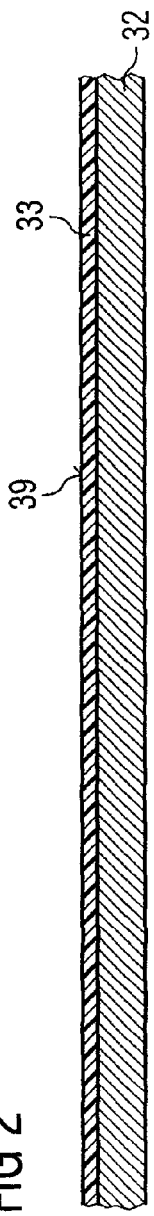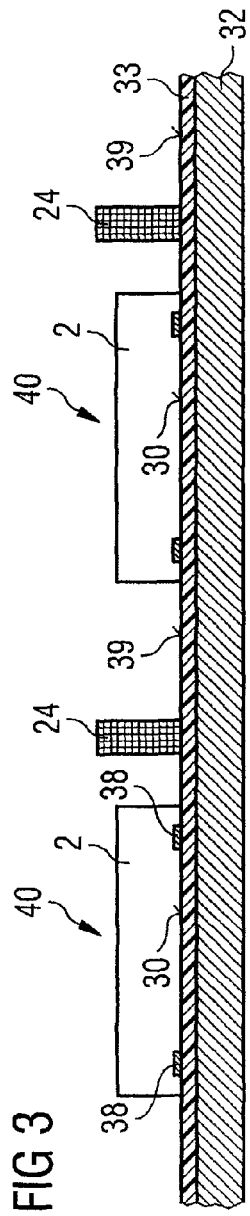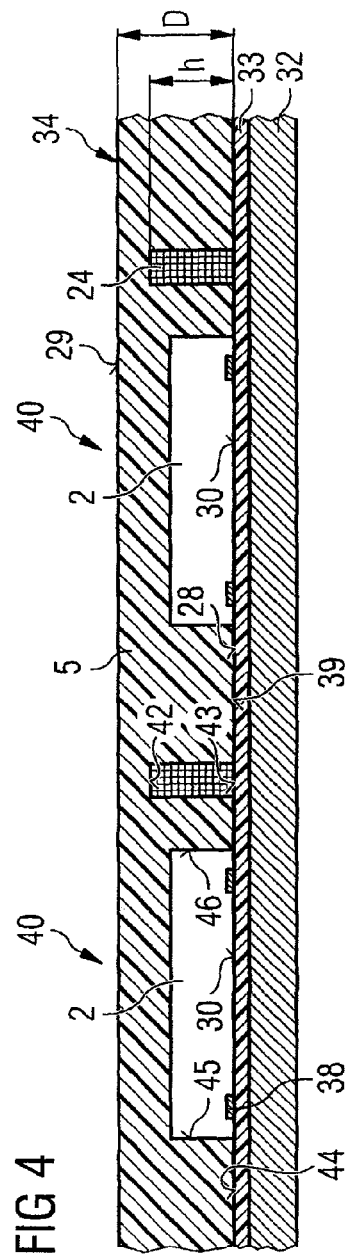

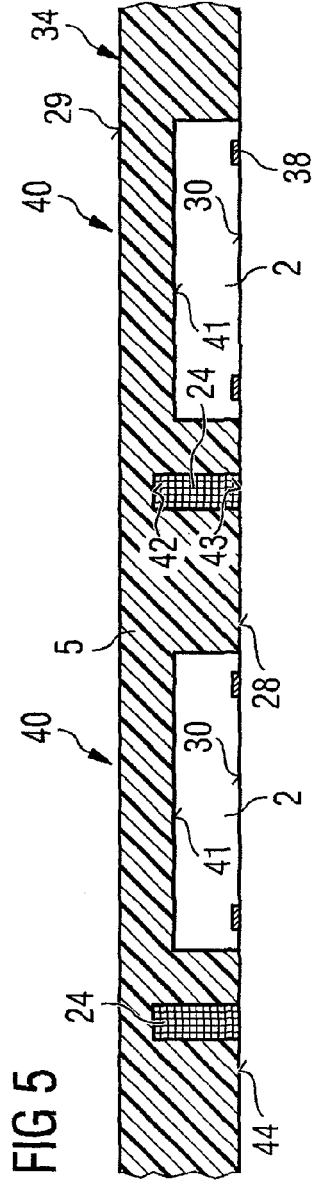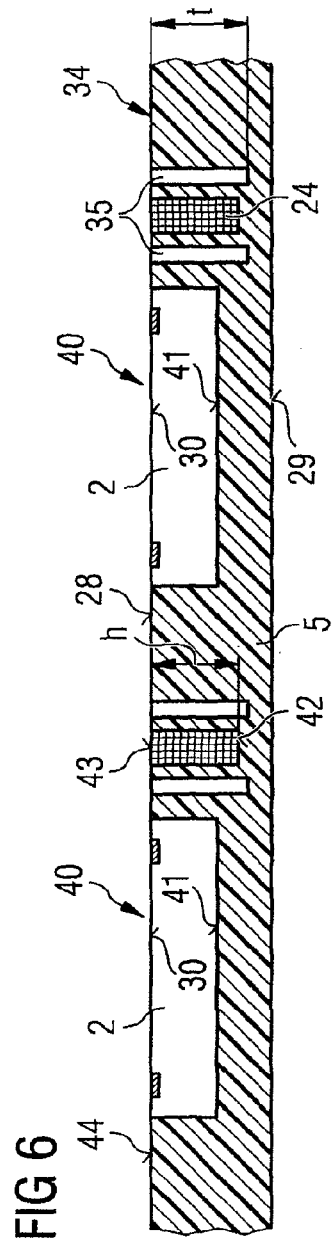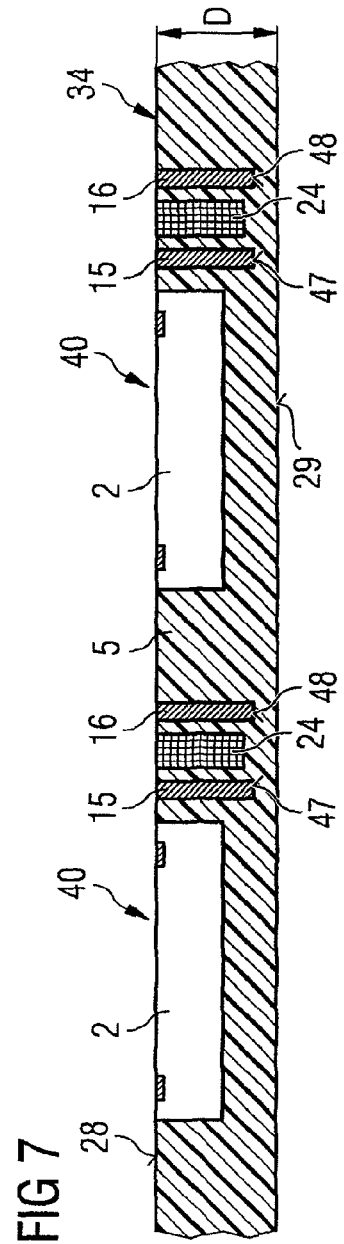

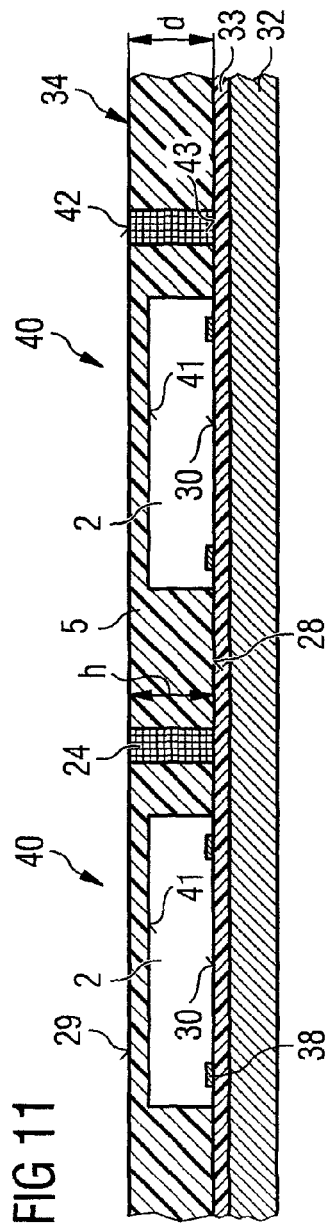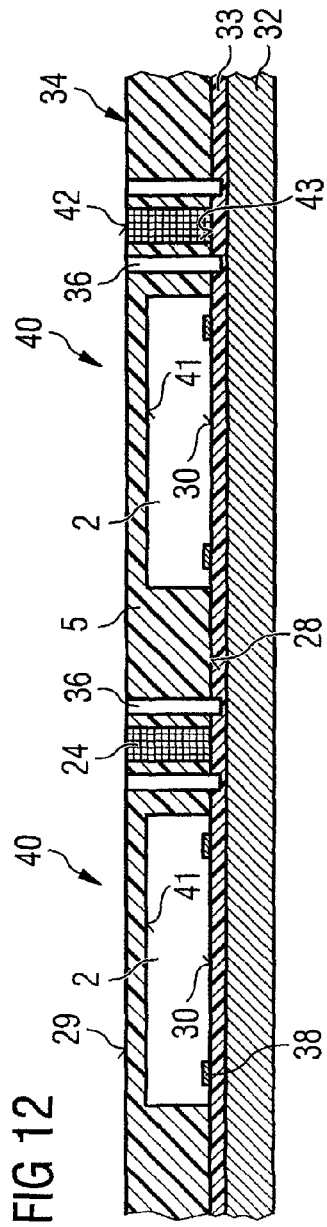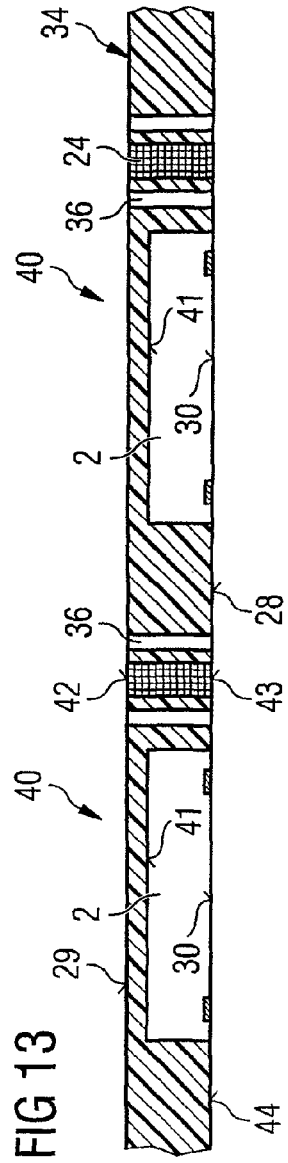

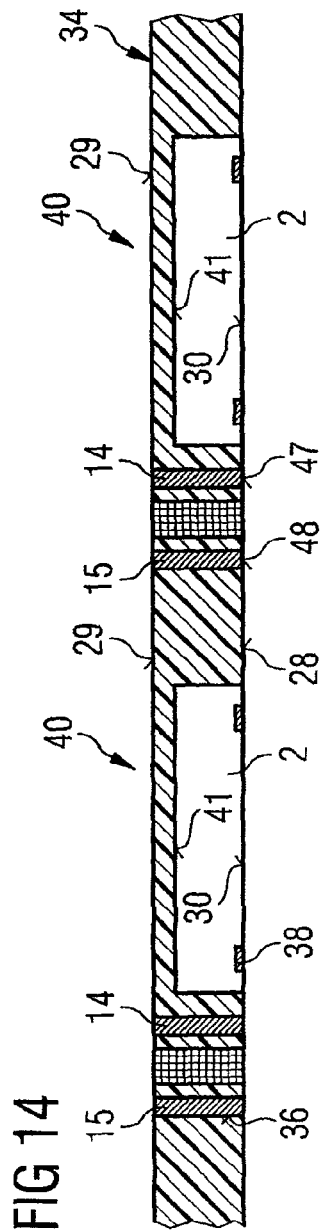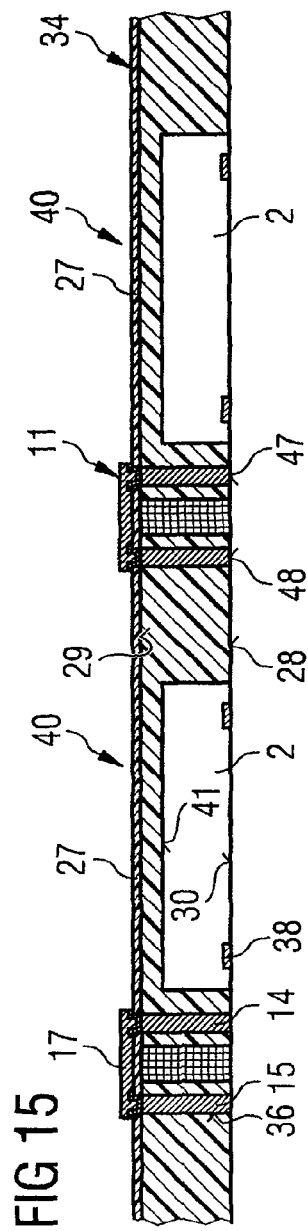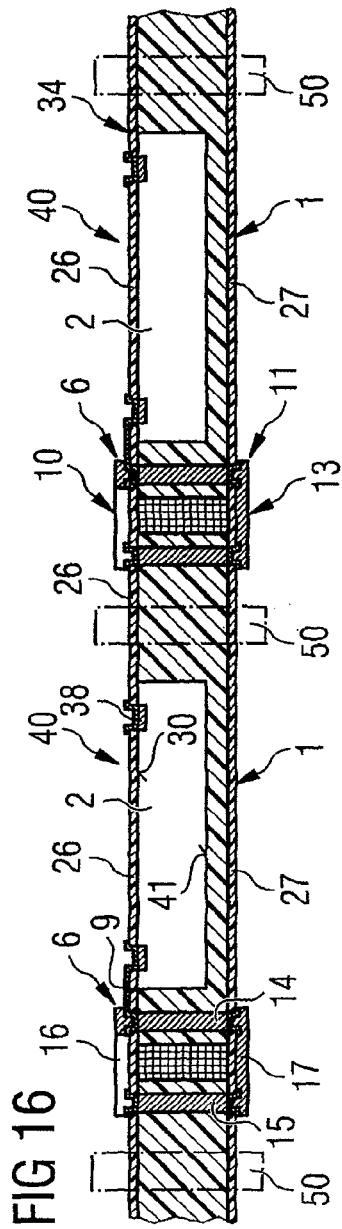

SEMICONDUCTOR COMPONENT INCLUDING A SEMICONDUCTOR CHIP AND A PASSIVE COMPONENT

The invention relates to a semiconductor component having at least one semiconductor chip and at least one passive component, and to a method for its production.

BACKGROUND

The expression a passive component means resistors, capacitors and coils, while active components include transistors, thyristors or diodes. In this case, the passive components can be provided directly on the semiconductor chip material by appropriate structure of suitable metal layers and isolation layers, which are normal during the production of a functional active semiconductor chip, to form capacitors or coils. In contrast, the resistors are normally provided in the semiconductor material of the semiconductor chip.

While the provision of capacitors is assisted by the flat structure of semiconductor chips, the provision of coils on these semiconductor chip surfaces is disadvantageously restricted to spiral coils. Coils which, for example, surround a ferromagnetic, ferrimagnetic or paramagnetic coil in a helical shape are virtually incompatible with the manufacturing methods for semiconductor chips.

However, it is known for transformer structures to be incorporated in dielectric plastic panels, with the coil turns surrounding a transformer core in a helical shape. For this purpose, a substrate in the form of a plastic panel is prepared by means of milling and drilling for the accommodation of the coil core and vertical segments of the coil windings. Preparation such as this for incorporation of core material and vertical coil segments is, however, impracticable in the case of conventional semiconductor components with at least one semiconductor chip in plastic encapsulation.

SUMMARY

The invention relates to a semiconductor component which has at least one semiconductor chip and at least one passive component. For this purpose, a semiconductor chip and a coil as a passive component are embedded in plastic encapsulation, in whose plastic encapsulation compound the semiconductor chip and the passive component as well as connection elements to form external contacts are arranged.

The invention will now be explained in more detail with reference to attached figures.

BRIEF DESCRIPTION OF THE DRAWINGS

FIG. 1 shows a schematic perspective view of a semiconductor component according to one embodiment of the invention;

FIGS. 2 to 10 show views of components during the production of a semiconductor component as shown in FIG. 1;

FIG. 2 shows a schematic cross section through a mounting board with a coating for the production of semiconductor components;

FIG. 3 shows a schematic cross section through the mounting board shown in FIG. 2 after application of semiconductor chips and coil cores to the coating;

FIG. 4 shows a schematic cross section through the mounting board shown in FIG. 3, after the semiconductor chips and the coil cores have been embedded in a plastic encapsulation compound to form a composite wafer;

FIG. 5 shows a schematic cross section through the composite wafer shown in FIG. 4, after removal of the mounting board;

FIG. 6 shows a schematic cross section through the composite wafer shown in FIG. 5, after introduction of blind holes;

FIG. 7 shows a schematic cross section through the composite wafer shown in FIG. 6, after the blind holes have been filled with electrically conductive material to form vertical coil segments;

FIG. 8 shows a schematic cross section through the composite wafer shown in FIG. 7, after thinning of the composite wafer;

FIG. 9 shows a schematic cross section through the thinned composite wafer shown in FIG. 8, after application of a lower wiring structure to a surface of the composite wafer;

FIG. 10 shows a schematic cross section through the thinned composite wafer shown in FIG. 9, after application of an upper wiring structure to a further surface of the composite wafer in order to produce the semiconductor components with a coil;

FIGS. 11 to 16 show views of components during the production of a semiconductor component according to a further embodiment of the invention;

FIG. 11 shows a schematic cross section through a mounting board after application of semiconductor chips and coil cores and after they have been embedded in a plastic encapsulation compound, forming a composite wafer;

FIG. 12 shows a schematic cross section through the mounting board shown in FIG. 11, after holes have been introduced into the plastic encapsulation compound of the composite wafer;

FIG. 13 shows a schematic cross section through the composite wafer shown in FIG. 12, after removal of the mounting board;

FIG. 14 shows a schematic cross section through the composite wafer shown in FIG. 13, after the holes have been filled with a conductive material to form vertical coil segments;

FIG. 15 shows a schematic cross section through the composite wafer shown in FIG. 14, after application of an isolation layer and a lower wiring structure;

FIG. 16 shows a schematic cross section through the composite wafer shown in FIG. 15, after application of an upper wiring structure in order to produce the semiconductor components with a coil;

FIG. 17 shows a schematic cross section through a mounting board with a coating for the production of semiconductor components;

FIG. 18 shows a schematic cross section through the mounting board shown in FIG. 17, after the application of semiconductor chips, coil cores and vertical coil segments;

FIG. 19 shows a schematic cross section through the mounting board shown in FIG. 18, after application of a plastic encapsulation compound to form a composite wafer;

FIG. 20 shows a schematic cross section through the composite wafer shown in FIG. 19, after removal of the mounting board;

FIG. 21 shows a schematic cross section through the composite wafer shown in FIG. 20, after application of a lower wiring structure to a surface of the composite wafer;

FIG. 22 shows a schematic cross section through the composite wafer shown in FIG. 21, after application of an upper wiring structure to a surface of the composite wafer;

DETAILED DESCRIPTION

Figure 8:
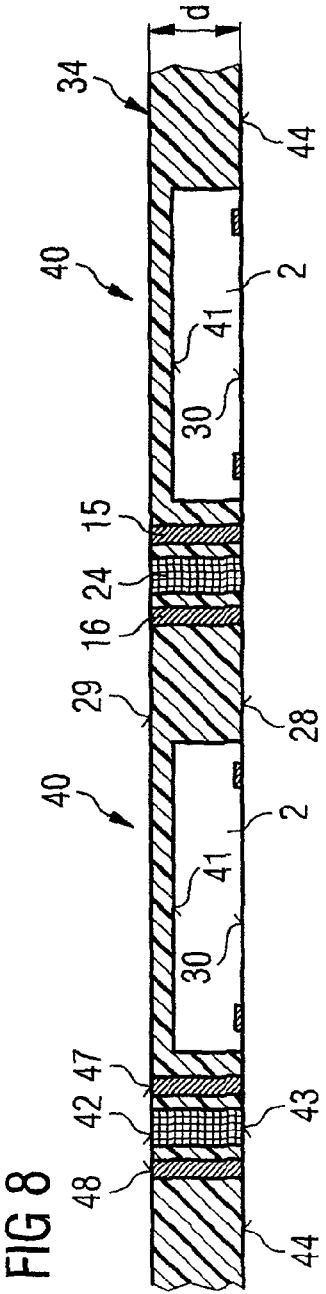

FIG. 1 shows a schematic perspective view of a semiconductor component 1 according to one embodiment of the invention. The semiconductor component 1 has a semiconductor chip 2 and a coil 6 as a passive component 3. The coil 6 and the semiconductor chip 2 are embedded in a plastic encapsulation compound 5 of plastic encapsulation 4 with connection elements 37. In this embodiment of the invention, one end 7 of the coil 6 is connected via an interconnect 9 to a contact pad 38 of the semiconductor chip 2. The other end 8 of the coil 6 is also electrically connected via an interconnect 9 to an adjacent contact pad 38.

The interconnects 9, the contact pads 38 and the ends 7 and 8 of the coil 6 are arranged on a planar surface 28, which is formed from the upper face 30 of the semiconductor chip 2 and the surrounding plastic encapsulation compound 5. This planar surface 28 makes it possible to form an upper wiring structure 10, composed of interconnects 9, contact pads 38 and ends 7 and 8 of the coil 6, on it. The coil 6 itself has vertical coil segments 14 and 15 as well as horizontal coil segments 16 and 17. While the horizontal coil segments 16 are formed from the upper wiring structure 10 from upper interconnect segments 18 with the ends 20 and 21, the horizontal coil segments 17, which are arranged on a lower planar surface 29, are formed from a lower wiring structure 11 from lower interconnect segments 19 with ends 22 and 23.

The vertical coil segments 14 and 15 extend from the upper wiring structure 10 in an area close to the upper face to a lower wiring structure 11 in an area close to the lower face of the semiconductor component 1, and connect the ends 20 and 21 of the upper interconnect segments 18 to the ends 22 and 23 of the lower interconnect segments 19. For this purpose, the vertical coil segments 14 and 15 have vias through the plastic encapsulation compound 5 of the plastic encapsulation 4. Furthermore, the vertical coil segments 14 and 15 are arranged in two adjacent rows alongside one another, and alternately make contact with ends 20 to 23 of the interconnect segments of the upper and of the lower wiring structures 10 and 11, respectively, so that the coil turns 13 are formed in a helical structure.

These coil turns 13 surround a coil core 24 in a helical shape. For this purpose, one turn 13 of the coil 6 has four coil segments 14 to 17, with one end 21 of the first interconnect segment 16 being connected to one end 22 of the second interconnect segment 17 via a vertical coil segment 15, and with a further vertical coil segment 14 being connected to the other end 23 of the lower interconnect segment 19. Furthermore, the coil turns 13 are arranged in such a manner that the coil connections 7 and 8 are arranged on the upper wiring structure 10.

The coil core 24 may have a ferromagnetic, ferrimagnetic or paramagnetic core material. If the core material is paramagnetic, it can be formed by the plastic encapsulation compound 5 itself. The coil core in the embodiment of the invention shown in FIG. 1 is in the form of a rod. However, other coil core shapes can also be embedded in the plastic encapsulation compound in order, for example, to form transformers with two or more coils. Finally, it is also possible for the semiconductor component 1 to have a plurality of upper and lower wiring layers which are isolated from one another and form interconnect segments 20 to 23 for coil turns 13, and to be connected to a plurality of rows of vias, which are arranged alongside one another, in such a manner that the semiconductor component 1 has a multilayer coil 6.

In the embodiment of the invention shown in FIG. 1, an isolation and passivation layer 27 is arranged on the lower and the upper wiring structures 10 and 11 respectively on the lower face of the plastic encapsulation 4, and an isolation and passivation layer 26 is arranged on the upper face 12 of the plastic encapsulation 4. In addition, the semiconductor component 1 has surface-mounted external contacts on the upper face 12, the external contact pads 31, which are connected to contact pads 38 on the upper wiring structure 10 on the upper face 30 of the semiconductor chips 2 through vias 51. These surface-mounted external contacts may have mesa structures, or may be soldered in the form of solder balls onto the external contact pads 31.

FIGS. 2 to 10 show views of components during the production of a plurality of semiconductor components 1, each having at least one semiconductor chip 2 and a coil 6 as a passive component 3. For this purpose, a composite wafer 34 is first of all produced from semiconductor chips 2, a coil core 24 and a plastic encapsulation compound 5 with an upper face 12 which comprises the plastic and the upper faces 30 of the semiconductor chips 2. A coil 6 is then introduced into the plastic encapsulation compound 5 in this composite wafer 34. If only the paramagnetic material of the plastic encapsulation compound 5 is provided as the coil core 24, then the coil 6 can be arranged completely between the semiconductor chips 2, which are arranged in rows and columns in the composite wafer, without any need to previously embed a coil core in the plastic encapsulation compound.

However, if core coils 24 are provided as shown in FIG. 1, then these can be arranged and encapsulated together with the semiconductor chips 2 before the coil turns 13 are introduced into the plastic encapsulation compound 5 between the semiconductor chips 2. A method such as this therefore has the advantage that both ferrimagnetic and ferromagnetic coil cores 24 can be combined with the coil turns 13, which can be introduced later. However, care should in this case be taken to ensure that the height of the coil core 24 is less than or equal to the thickness of the plastic encapsulation compound 5.

In this context, FIG. 2 shows a schematic cross section through a mounting board 32 with a coating 33 for the production of semiconductor components. A mounting board 32 such as this is preferably in the form of a wafer, on which semiconductor component positions can then be provided in rows and columns. The coating 33 on the mounting board 32 may be an adhesive layer or a double-sided adhesive film, in order to position the components of the semiconductor components on its upper face 39.

FIG. 3 shows a schematic cross section through the mounting board 32 as shown in FIG. 2 after application of semiconductor chips 2 and coil cores to the coating 33. The adhesive effect of the coating 33 results in the semiconductor chips and the coil cores adhering at the intended semiconductor component positions 40, of which FIG. 3 shows details of two semiconductor component positions 40. The semiconductor chips 2 are fixed by their upper faces 30 on the coating 33 so that their contact pads 38 are protected against being wetted by plastic encapsulation compound. The coil cores 24 are positioned in spaces between the semiconductor chips 2 in such a manner that it is possible to split the semiconductor component positions 40 into individual semiconductor components without damaging the coil cores 24.

FIG. 4 shows a schematic cross section through the mounting board 32 as shown in FIG. 3 after the semiconductor chips 2 and the coil cores 24 have been embedded in a plastic encapsulation compound 5 to form a composite wafer 34. The dimensions of a composite wafer 34 such as this correspond to the dimensions of a semiconductor wafer as is normal in semiconductor manufacture, so that the composite wafer 32 can advantageously be processed further as a semiconductor wafer in appropriate steps that are known from semiconductor manufacture. The plastic encapsulation compound 5 covers the rear faces 41 and edge faces 45 and 46 of the semiconductor chips 2, and the rear faces 42 of the coil cores 24 completely, with the thickness D of the composite panel in this embodiment being greater than the height h of the coil cores 24.

The upper face 39 of the coating 33 ensures that a planar surface 28 is formed as the upper face of the composite wafer 34 after encapsulation with a plastic encapsulation compound 5. This planar surface 28 is formed by the upper faces 30 of the semiconductor chips 2, the upper faces 43 of the coil cores 24, and the upper face 44 of the plastic encapsulation compound 5. This common planar surface 28 is also referred to as a coplanar surface and is used during the rest of the process of manufacturing the semiconductor components for planar application of various isolation and metallization layers.

FIG. 5 shows a schematic cross section through the composite wafer 34 as shown in FIG. 4 after removal of the mounting board 32, as is shown in FIG. 4. The planar surface 28 is now completely accessible as the upper face of the composite wafer 34, and is formed from the surfaces 44 of the plastic encapsulation compound 5, the surfaces 43 of the coil cores 24 and the upper faces 30 of the semiconductor chips 2. In addition, the composite wafer 34 has a planar surface 29 as a lower face, which is formed from the plastic encapsulation compound 5.

FIG. 6 shows a schematic cross section through the composite wafer 34 as shown in FIG. 5 after introduction of blind holes 35. The blind holes 35 are introduced on both sides of the coil core, with their depth t being greater than the height h of the coil former 24. An anisotropic etching technique can be provided for introduction of blind holes 35 such as these, during which the planar surface 28 is protected by a structured protective layer against being attacked during the etching process, and only those positions in which the blind holes 35 are intended to be introduced into the plastic encapsulation compound 5 are kept free of this masking protective layer. An anisotropic etching technique such as this can preferably be carried out with the aid of reactive plasma etching. For this purpose, highly accelerated ions react with the plastic encapsulation compound to form volatile substances in the exposed areas in which the blind holes 35 are intended to be created.

A further possible way to introduce blind holes 35 such as these is to use laser beams to remove the plastic encapsulation compound 5. In this case, the plastic encapsulation compound 5 is heated in such a manner that it decomposes into volatile substances when subjected to the laser beam. A laser beam method such as this has the advantage that blind holes 35 can be produced in the micrometer range so that hair-thin vertical coil segments can be created when they are subsequently filled with a conductive material.

FIG. 7 shows a schematic cross section through the composite wafer 34 shown in FIG. 6 after the blind holes 35 have been filled with conductive material. A conductive material such as this can be applied in the blind holes 35 after the application of a so-called "seedlayer" by means of electrochemical deposition, or can be applied by vapor-deposition and sputtering techniques. In addition to these physical methods, chemical deposition methods for conductive materials are also possible. After the blind holes 35 have been filled with conductive materials such as these to form vertical coil segments 15 and 16, the composite wafer 34 can now be thinned from its lower face 29, which is formed from plastic encapsulation compound 5, until the ends 47 and 48 of the vertical coil segments 15 and 16 are exposed. A composite wafer 34 such as this can be thinned by means of CMP processes, during which a chemo-mechanical polishing process is carried out on the composite wafer lower face 29 until the ends 47 and 48 of the vertical coil segments 15 and 16 are reached.

FIG. 8 shows a schematic cross section through the composite wafer 34 as shown in FIG. 7 after the composite wafer 34 has been thinned from the thickness D, as is shown in FIG. 7, to a thickness d. The chemo-mechanical polishing process results in a planar surface 29 on the lower face 29 of the thinned composite wafer 34, so that two plane-parallel planar surfaces 29 and 28 can now respectively be used as the lower face and upper face of the composite wafer 34 for further processing. During this process, the composite wafer 34 was thinned until the rear faces 42 of the coil formers 24 are now also exposed. An isolation layer is therefore first of all applied, before the application of a lower wiring structure to the lower face 29 of the composite wafer 34, and is then structured so as to allow access to the vertical coil segments 15 and 16 from the lower face.

Figure 9:
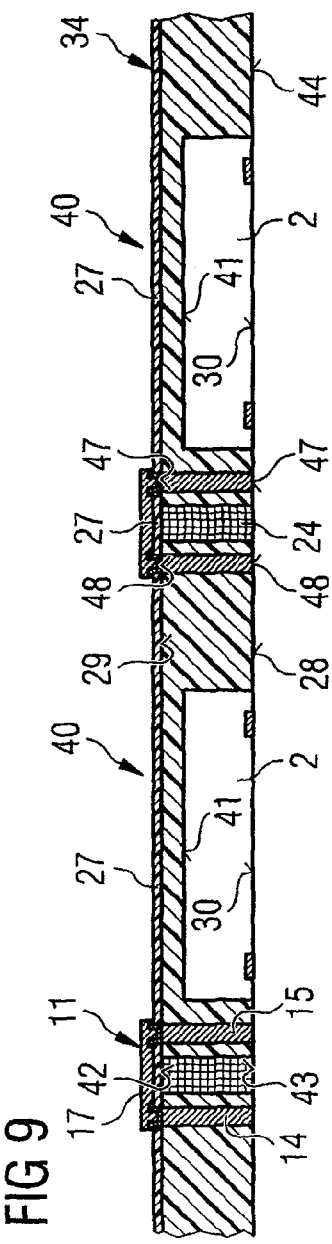

FIG. 9 shows a schematic cross section through the thinned composite wafer 34 as shown in FIG. 8, after application of a lower wiring structure 11 to one surface of the composite wafer 34, with this surface being formed by the planar surface 29 on the lower face of the composite wafer 34. For this purpose, an isolation layer 27 is first of all applied to the planar surface 29 on the lower face of the composite panel 34, and is then structured such that at least the vertical coil segments 14 and 15 are freely accessible, while the rear faces 42 of the coil core 24 are still covered by the isolation layer 27. The vertical coil segments 14 and 15 can now be connected alternately to horizontal coil segments 17 of the lower wiring structure 11. A wiring structure 10 can then be applied, in a subsequent step, to the planar surface 28 of the upper face of the composite wafer 34.

Figure 10:
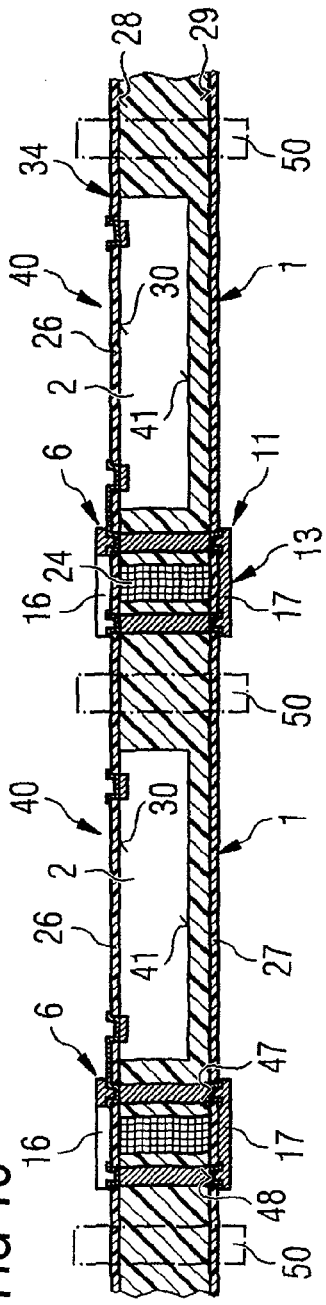

FIG. 10 shows a schematic cross section through the thinned composite wafer 34 as shown in FIG. 9, after application of an upper wiring structure 10 to one surface of the composite wafer 34 in order to manufacture the semiconductor components 1 with a coil 6. For this purpose, as is shown in FIG. 10, the planar surface 28 on the upper face of the composite wafer 34 is used in order to first of all apply a planar isolation layer 26, which insulates the upper faces 43 of the coil cores 24 and, after structuring of the isolation layer 26, exposes the ends of the vertical coil segments 14 and 15 in such a manner that the ends of the vertical coil segments 14 and 15 can be connected to one another alternately via horizontal coil segments 16.

This results in a coil turn 13 of a semiconductor component 1 with a helical coil 6 and a semiconductor chip 2 composed of four segments, two horizontal segments 16 and 17 and two vertical segments 14 and 15, which are each applied to and introduced into the plastic encapsulation compound 5 between the semiconductor chips 2 in different ways. In order to produce individual semiconductor components 1, the composite wafer is then, or after further protective layers have been applied to the lower face and the upper face of the composite wafer 34, split along the separating joints 50 into individual semiconductor components 1.

FIGS. 11 to 16 show views of components during the production of a semiconductor component 1 according to a further embodiment of the invention. In this case, a mounting board 32 with a coating 33 is once again first of all made available. This is fitted with semiconductor chips 2 and coil cores 24, and is then covered with a plastic encapsulation compound 5. The thickness d of the plastic encapsulation compound 5 and thus of the composite wafer 34 as well corresponds in this further embodiment of the invention exactly to the height h of the coil cores 24. In this case, the coil cores 24 can also be used in order to make the thickness d of the plastic encapsulation compound 5 equal to the height h of the coil cores 24, by means of a wiper.

In this context, FIG. 11 shows a schematic cross section through a mounting board 32 after application of semiconductor chips 2 and coil cores 24, and after these have been embedded in the plastic encapsulation compound 5, in order to form a composite wafer 34. In this case, FIG. 11 shows only two semiconductor component positions 40 on the composite panel 34. Components with the same functions as in the previous figures are identified by the same reference symbols, and will not be explained again. One advantage of this second embodiment of the invention is that there is no need to grind the plastic encapsulation compound to be thin.

FIG. 12 shows a schematic cross section through the mounting board 32 as shown in FIG. 11 after the introduction of holes 36 into the plastic encapsulation compound 5 of the composite wafer 34. On this occasion, the holes 36 are in the form of vias through the plastic encapsulation compound 5, so that the vias are produced in the plastic encapsulation compound 5 after removal of the mounting board 32 with the coating 33.

FIG. 13 shows a schematic cross section through the composite wafer 34 as shown in FIG. 12, after removal of the mounting board 32. This composite panel 34 is already at its final thickness d, which corresponds to the height h of the coil cores 24. Furthermore, after removal of the mounting board 32 with the coating 33, this composite panel has vias which can now be filled with a conductive material to form vertical coil segments. The vias 36 now make it possible to apply an isolation layer and a wiring structure to the planar surface 29 of the lower face of the composite wafer 34.

FIG. 14 shows a schematic cross section through the composite wafer 34 as shown in FIG. 13, after the holes have been filled with a conductive material to form coil segments 14 and 15. For this purpose, the conductive material may have a metal or a heavily doped polysilicon. This conductive material can be applied by means of chemical or electrolytic deposition. In the case of electrolytic deposition, a "seedlayer" is once again deposited first of all, for example by means of a sputtering technique, so that a current can flow in an electrolytic deposition bath. Other CVD or PVD methods can also be used in order to deposit vertical coil segments 14 and 15 in the holes 36.

FIG. 15 shows a schematic cross section through the composite wafer 34 as shown in FIG. 14, after application of an isolation layer 26, which is then structured such that the ends of the vertical coil segments 14 and 15 are exposed. These vertical coil segments 14 and 15 are in turn connected to one another alternately by means of a wiring structure 11, which is arranged on the lower face of the composite wafer 34, and with the aid of appropriate horizontal interconnect segments 17, as has already been shown in FIG. 9.

FIG. 16 shows a schematic cross section through the composite wafer 34 as shown in FIG. 15, after application of an upper wiring structure 10 in order to complete the semiconductor components 1 with a coil 6. For this purpose, a structured isolation layer 26 is once again applied first of all, on which a structured metal layer is then deposited in order to apply interconnects 9 and horizontal coil segments 16.

Figure 17:
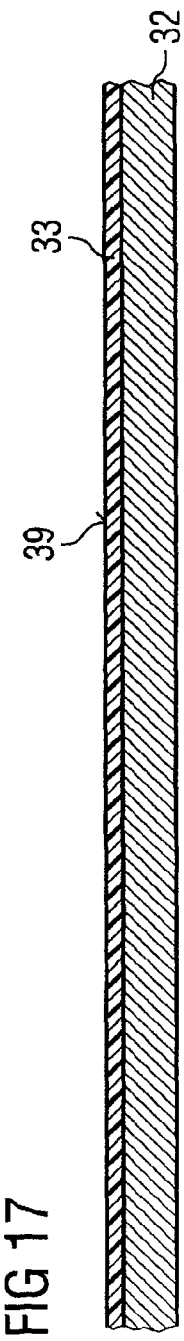
FIGS. 17 to 22 show views of components during the production of a semiconductor component according to a further embodiment of the invention.
Figure 18:
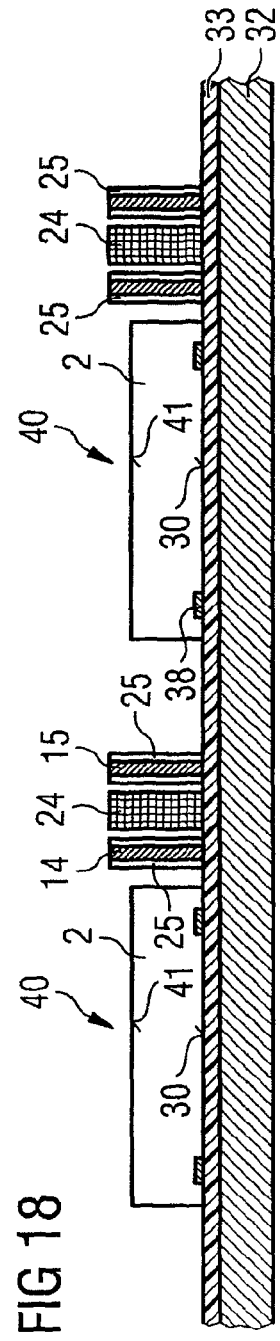

FIGS. 17 to 22 shown views of components during the production of a semiconductor component 1 according to a further embodiment of the invention. First of all, as is shown in FIG. 17, the process starts once again with a mounting board 32 with a coating 33 for the production of semiconductor components 1. However, on this occasion, not only are semiconductor chips 2 and coil cores 24 applied to the coating 33, but also webs 25, as shown in FIG. 18.

FIG. 18 shows a schematic cross section through the mounting board as shown in FIG. 17, after application of semiconductor chips 2, coil cores 24 and vertical coil segments 14 and 15, which are arranged in webs 25. These webs 25 may be composed of high-impedance silicon and may have vertical coil segments 14 and 15, so that webs 25 such as these can be fixed in a simple manner on both sides of the coil core 24 in each of the semiconductor component positions 40 on the mounting board 32 and on the coating 33. Webs 25 such as these with vertical coil segments 14 and 15 can be produced in large quantities at low cost. During the assembly of semiconductor components with vertically arranged coil segments 14 and 15, it is thus possible to exploit the capabilities offered by so-called wafer-level packaging advantageously in order to rationalize the production of semiconductor components with semiconductor chips 2 and helical coils 6. Instead of silicon webs with corresponding filigrane coil segments 14 and 15 with a thickness of a few micrometers, it is also possible to use other isolation webs for coil segments 14 and 15 such as these.

Figure 19:
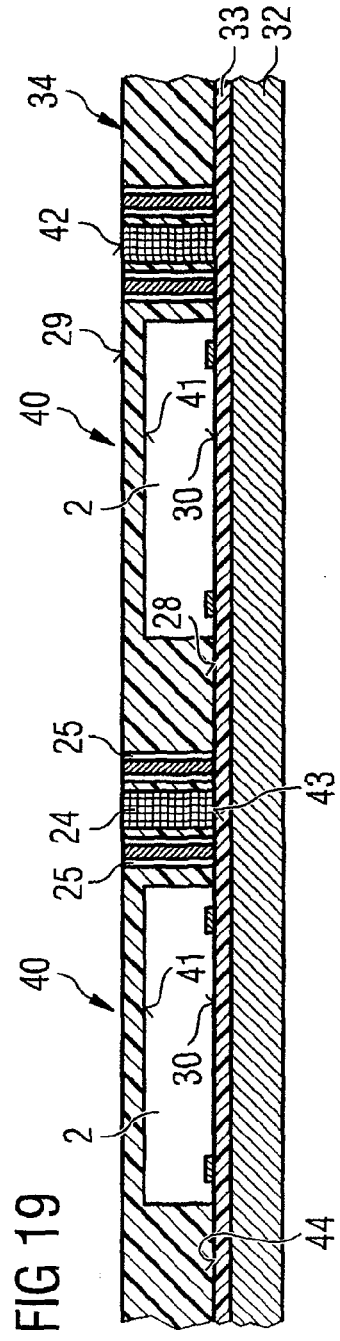

FIG. 19 shows a schematic cross section through the mounting board 32 as shown in FIG. 18, after application of a plastic encapsulation compound 5 in order to form a composite wafer 34. In this case, it is once again possible to use a method in which a relatively planar surface 29 is created as the lower face of the composite wafer 34. Contact can be made at least with the vertical coil segments from this planar surface 29. In this case, which is shown in FIG. 19, the rear faces 42 of the coil cores 24 are also exposed, so that insulation is required on the rear face of the coil core.

Figure 20:
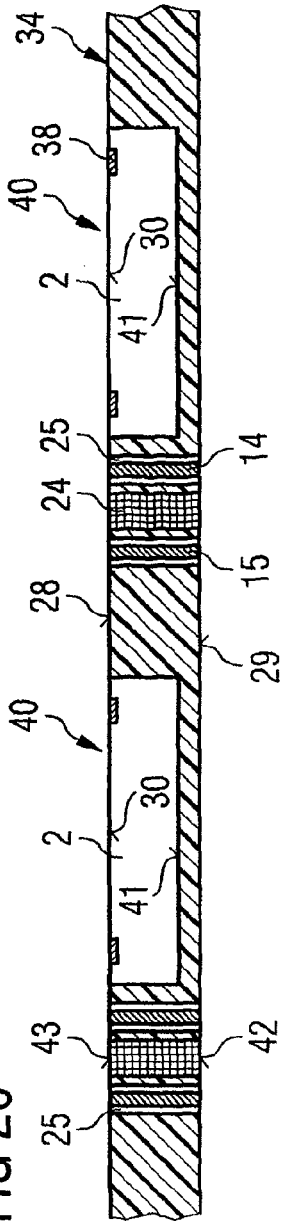

FIG. 20 shows a schematic cross section through the composite wafer 34 after removal of the mounting board 32 shown in FIG. 19. This composite wafer 34 has a planar lower face 29 and a planar upper face 28, which are suitable for application of a lower and upper wiring structure, respectively.

Figure 21:
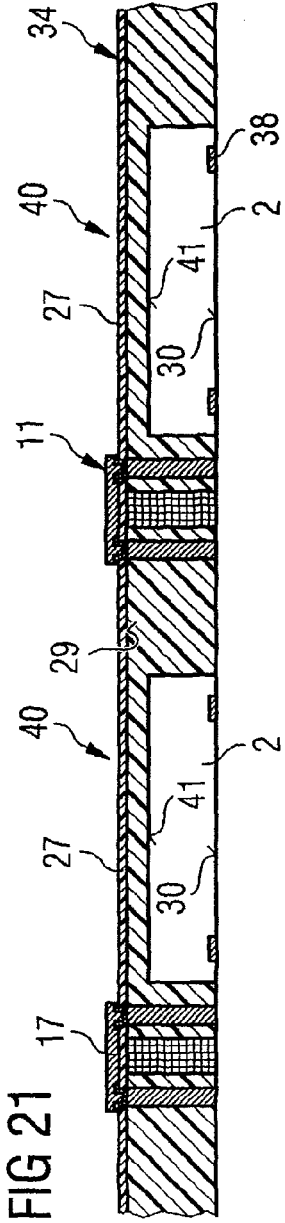

For this purpose, as is shown in FIG. 21, an isolation layer 27 is first of all applied to the planar surface 29 of the lower face of the composite wafer 34, is structured and is coated with a lower wiring structure 11.

Figure 22:
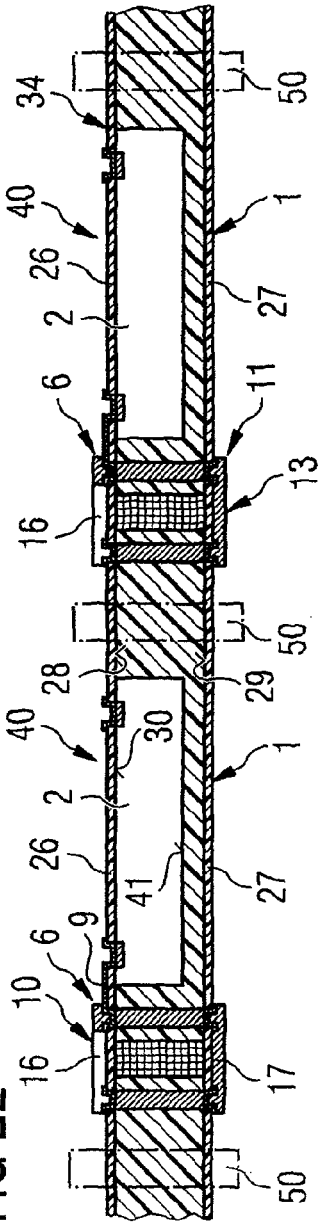

Then, as the next FIG. 22 shows, the planar surface 28 on the upper face of the composite wafer 34 is likewise provided with a structured isolation layer 26, to which an upper wiring structure 11 is applied, which at the same time produces a connection, via interconnects 9, between the coil 6 and the semiconductor chip 2, and the contact pads 38 on the semiconductor chip 2. This can be achieved by a single selective metalization step, or else conductive reinforcement can be carried out in the area of the turns 13 of the coils 6 in order to represent the horizontal coil segments 16 and 17, respectively.

FIG. 22 thus shows a schematic cross section through the composite wafer 34 after application of an upper wiring structure 10 to one surface of the composite wafer 34 in order to complete the semiconductor components 1 with semiconductor chips 2 and helical coils 6.

Figure 23:
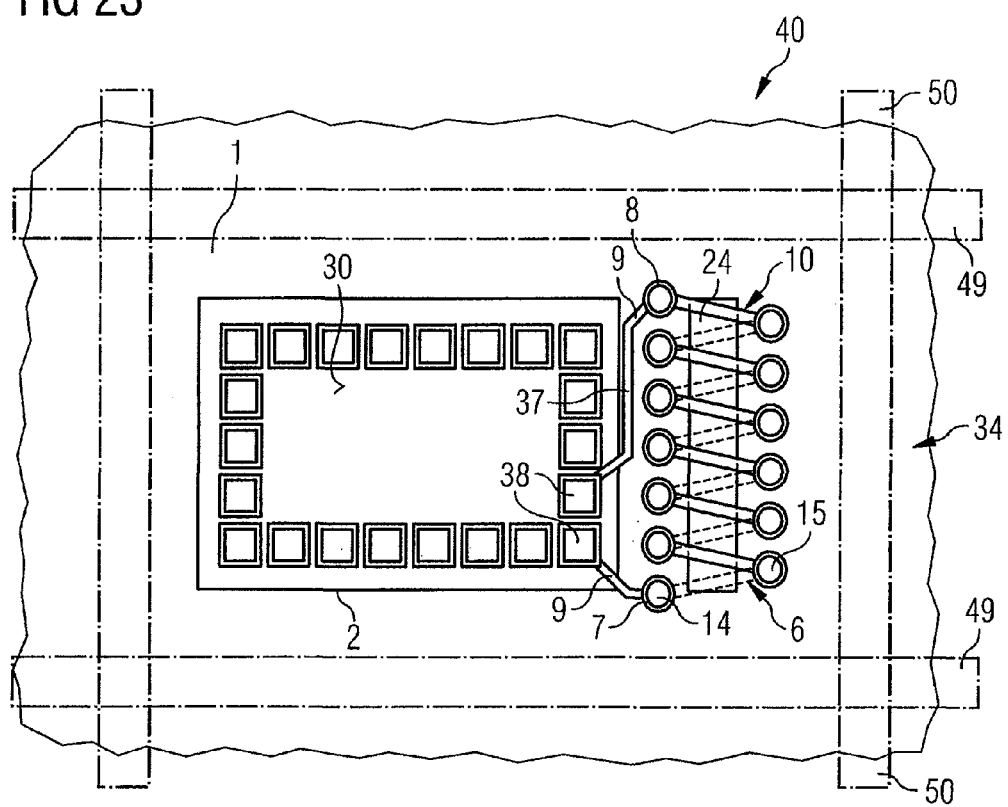
FIG. 23 shows a schematic plan view of a detail of the composite wafer shown in FIGS. 10, 16 and 22.

FIG. 23 shows a schematic plan view of a detail of the composite wafer 34 as shown in FIGS. 10, 16 and 22, in the area of a semiconductor component position 40. For this purpose, an upper isolation layer 26 has been omitted in FIG. 23, in order to show the interaction between the coil 6 and the semiconductor chip 2. The vertical coil segments 14 and 15 are arranged in rows alongside the coil core 24.

In this case, the vertical coil segments 14 and 15 are not directly opposite one another, but are arranged offset with respect to one another, so that the helical structure of this coil 6 becomes evident. The coil ends 7 and 8 are electrically connected via interconnects 9 and by means of an upper wiring structure 10 to correspondingly provided adjacent contact pads 38 on the upper face 30 of the semiconductor chip 2. The composite wafer 34 has semiconductor component positions 40 which are arranged in rows and columns and are shown in FIG. 23, with separating joints 50 being arranged in the column direction and separating joints 49 being arranged in the row direction, by means of which the composite wafer 34 can be split into individual semiconductor components 1. In addition, external contact pads can be arranged on the contact pads 38 and are themselves in time fitted with external contacts, in which case the external contacts can be surface-mounted, and may be in the form of solder balls or mesa structures.

Figure 24:
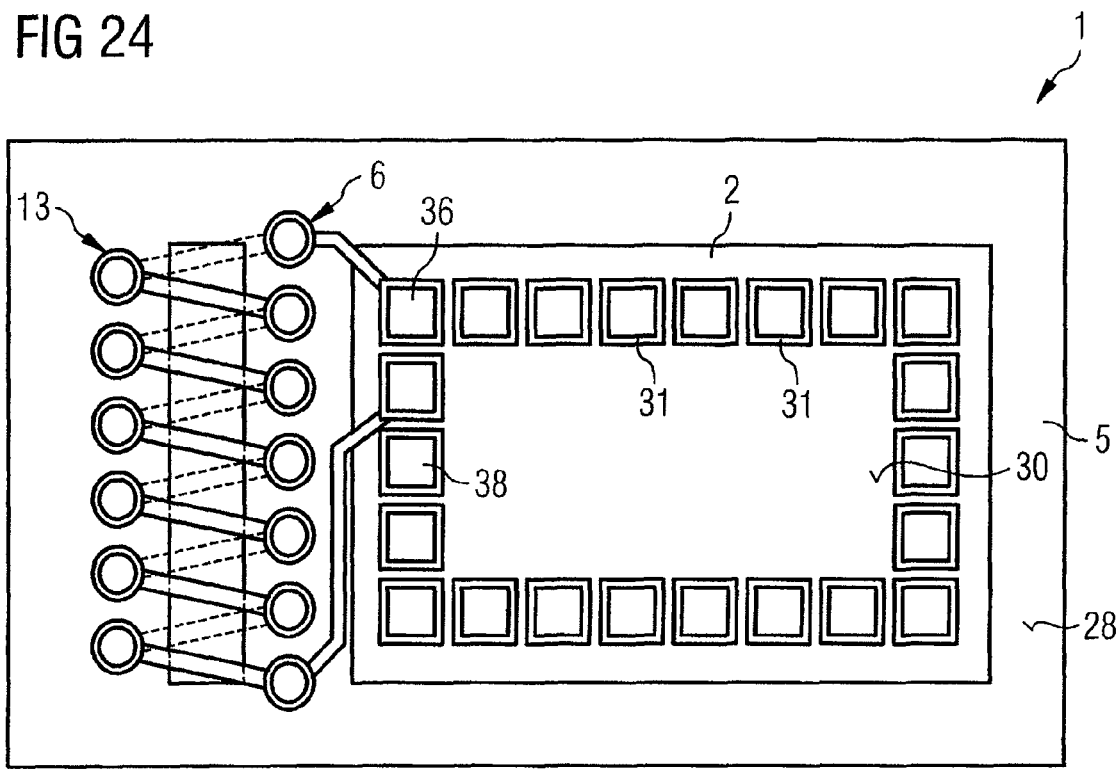
FIG. 24 shows a schematic plan view of the semiconductor component shown in FIG. 23, after splitting of the composite wafer.

FIG. 24 shows a schematic plan view of the semiconductor component 1 as shown in FIG. 23, after splitting of the composite wafer, so that this now results in a semiconductor component 1 in a plastic encapsulation compound 5, in which the semiconductor chip 2 and the coil 6 are embedded. In this embodiment of the invention, the coil 6 has six coil turns 13, each of which are composed of four coil segments, as is also illustrated in the cross section shown in FIG. 25.

Figure 25:
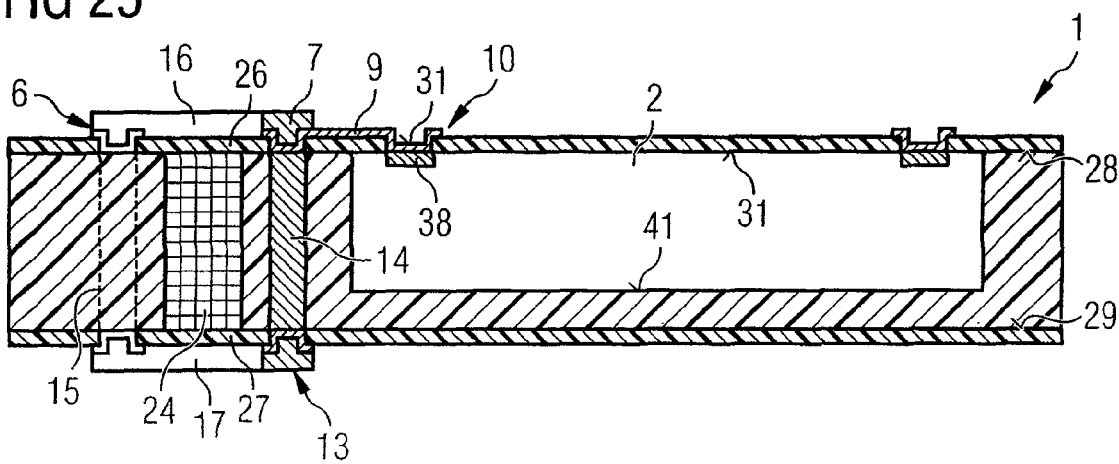
FIG. 25 shows a schematic cross section through a semiconductor component as shown in FIG. 24.

FIG. 25 shows a schematic cross section through a semiconductor component 1 as shown in FIG. 24. A vertical coil segment 14 of a coil turn 13 can be seen in this cross section, while the associated second vertical coil segment 15 is represented only by a dashed line. One turn 13 of the coil 6 has horizontal coil segments 16 and 17, which make contact with the vertical coil segments 14 and 15. Isolation layers 26 and 27 are arranged between the respective horizontal coil segments 14 and 15 and the coil core 24 in order to ensure that the ferrimagnetic material or ferromagnetic material of the coil core 24 does not cause a short between the coil turns 13. One end 7 of the coil 6 is electrically connected via an interconnect 9 in an upper wiring structure 10 on the planar surface 28 to a contact pad 38 on the semiconductor chip 2. The contact pad 38 may also be fitted with external contact pads on which, by way of example, solder balls are arranged as external contacts.

Figure 26:
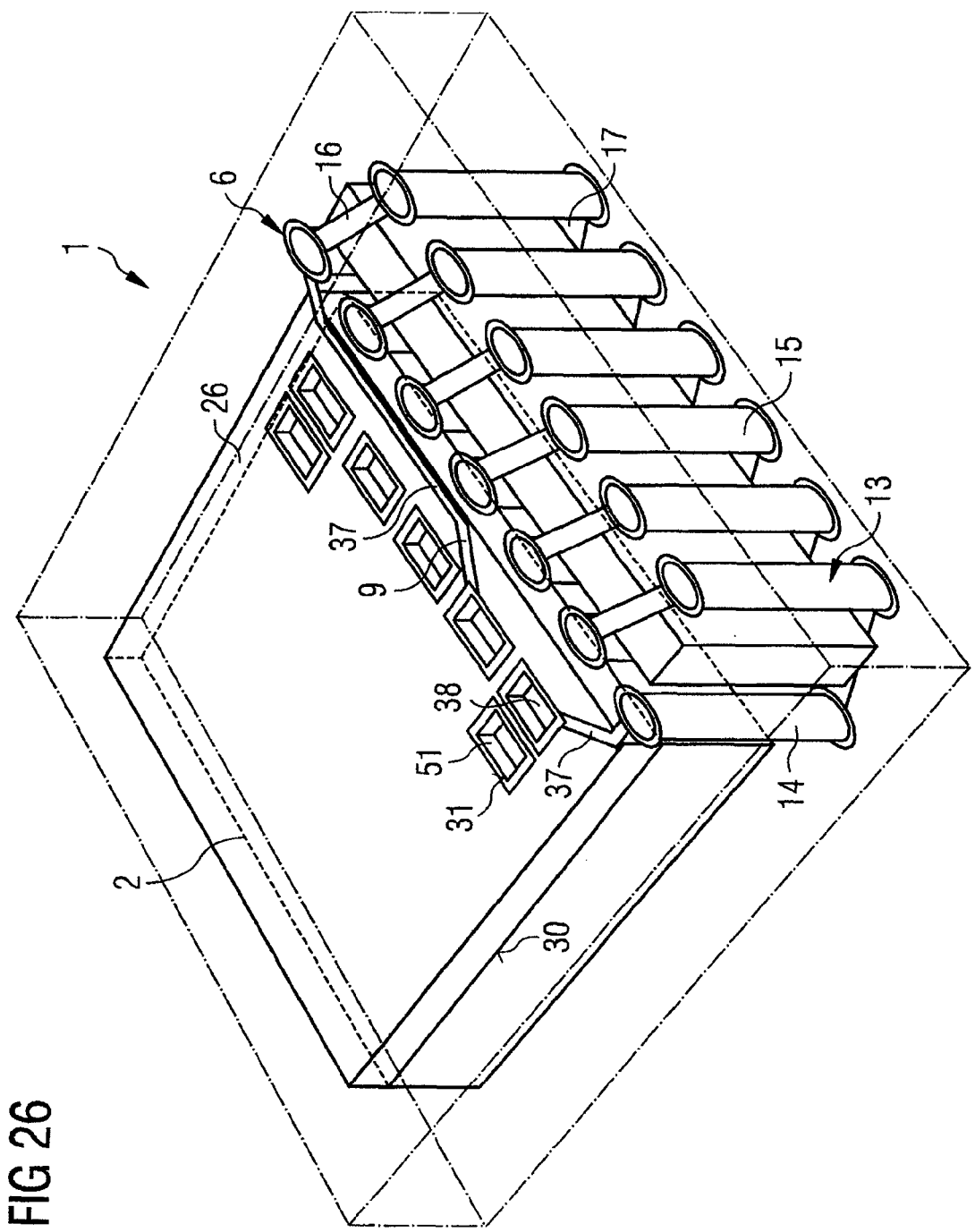
FIG. 26 shows a schematic perspective view of connection elements between a coil and a semiconductor chip of the semiconductor component shown in FIG. 25.

FIG. 26 shows a schematic perspective view of connection elements 37 between the coil 6 and the semiconductor chip 2. As is shown in FIG. 1, the semiconductor chip 2 is covered by an isolation layer, through which vias 51 or via windows produce a connection between the external contact pads 31 and contact pads 38 on the upper face of the semiconductor chip 2. The external contour of the semiconductor component 1 is marked by a dashed-dotted line, while the dotted lines approximately represent the contours of the semiconductor chip 2.

The invention claimed is:

1. A semiconductor component comprising:
a semiconductor chip;
a coil formed as a passive component; and
a plastic encapsulation structure comprising a plastic encapsulation compound that embeds the semiconductor chip, the coil and connection elements that form external contacts at an external surface of the plastic encapsulation structure;
wherein the semiconductor chip includes an upper surface, a lower surface and side surfaces extending between the upper and lower surfaces, the semiconductor chip further includes contact pads disposed on the upper surface, the coil includes vertical and horizontal coil segments, the coil is disposed alongside the semiconductor chip such that at least a portion of each of the vertical coil segments is at the same elevation as the side surfaces of the semiconductor chip, at least one end of a vertical coil segment and at least one contact pad are coplanar with the external surface of the plastic encapsulation structure, the vertical coil segments extend from an upper wiring structure in an area close to the upper surface to a lower wiring structure disposed in an area close to the lower surface of the semiconductor component, and at least one of an isolation and a passivation layer is arranged on the lower and upper wiring structures.

2. The semiconductor component of claim 1, wherein at least one end of the coil is electrically connected to the semiconductor chip via an interconnect of the upper wiring structure disposed on the external surface of the plastic encapsulation structure.

3. The semiconductor component of claim 1, wherein the vertical coil segments comprise vias through the plastic encapsulation compound of the plastic encapsulation structure.

4. The semiconductor component of claim 1, wherein the vertical coil segments are arranged in two adjacent rows that extend alongside one another.

5. The semiconductor component of claim 1, wherein the horizontal coil segments comprise interconnect segments of the upper wiring structure located in an area that is close to the external surface of the plastic encapsulation structure, and the horizontal coil segments further comprise interconnect segments of the lower wiring structure in the area close to the lower surface of the semiconductor component.

6. The semiconductor component of claim 4, wherein ends of the interconnect segments of the upper and of the lower wiring structures make contact in an alternating manner with the vertical coil segments such that the vertical and horizontal coil segments connect together to form a helical structure.

7. The semiconductor component of claim 1, wherein the coil surrounds a coil core.

8. The semiconductor component of claim 7, wherein the coil core comprises the plastic encapsulation compound.

9. The semiconductor component of claim 7, wherein the coil core comprises a ferrimagnetic material.

10. The semiconductor component of claim 7, wherein the coil core comprises a ferromagnetic material.

11. The semiconductor component of claim 7, wherein the coil core comprises a paramagnetic material.

12. The semiconductor component of claim 1, wherein a plurality of vertical coil segments are embedded in rows in predetermined insulating webs, and the webs including the embedded vertical coil segments extend from the lower wiring structure to the upper wiring structure.

13. The semiconductor component of claim 1, wherein the semiconductor component comprises a multilayer coil that includes a plurality of upper and lower wiring layers which are isolated from one another, form interconnect segments that define turning portions of the coil, and are connected to a plurality of rows of vias, the rows being arranged alongside one another.

14. A semiconductor component comprising:
a semiconductor chip;
a coil formed as a passive component; and
a plastic encapsulation structure comprising a plastic encapsulation compound that embeds the semiconductor chip, the coil and connection elements that form external contacts at an external surface of the plastic encapsulation structure;
wherein at least one end of the coil is electrically connected to the semiconductor chip via an interconnect of an upper wiring structure disposed on the external surface of the plastic encapsulation structure, and the semiconductor component comprises surface-mounted external contacts located on the external surface of the plastic encapsulation structure and arranged on external contact pads of the upper wiring structure.

15. The semiconductor component of claim 1, wherein each of the semiconductor chip and the coil is embedded by the same encapsulation structure.

16. The semiconductor component of claim 1, wherein both the semiconductor chip and the coil are embedded by a single encapsulation structure.

17. A semiconductor component comprising:
a semiconductor chip;
a coil formed as a passive component; and
a plastic encapsulation structure comprising a plastic encapsulation compound that embeds the semiconductor chip, the coil and connection elements that form external contacts at an external surface of the plastic encapsulation structure;
wherein the coil is embedded by only the plastic encapsulation structure.

18. The semiconductor component of claim 1, wherein the coil comprises a helical coil having a three dimensional configuration that extends within the plastic encapsulation structure.

19. The semiconductor component of claim 1, further comprising connection elements that connect the coil with the contact pads of the semiconductor chip.

20. A semiconductor component comprising:
a semiconductor chip;
a coil formed as a passive component; and
a plastic encapsulation structure comprising a plastic encapsulation compound that embeds the semiconductor chip, the coil and connection elements that form external contacts at an external surface of the plastic encapsulation structure;
wherein the coil comprises horizontal and vertical coil segments, each of the horizontal and vertical segments being separated from the semiconductor chip, and at least one end of the coil is electrically connected to the semiconductor chip via an interconnect of an upper wiring structure disposed on the external surface of the plastic encapsulation structure.

* * * * *